(12) United States Patent
Paek

(10) Patent No.: US 12,347,737 B2
(45) Date of Patent: Jul. 1, 2025

(54) SEMICONDUCTOR DEVICE WITH A POROUS AIR VENT

(71) Applicant: Micron Technology, Inc., Boise, ID (US)

(72) Inventor: Jong Sik Paek, Taichung (TW)

(73) Assignee: Micron Technology, Inc., Boise, ID (US)

( * ) Notice: Subject to any disclaimer, the term of this patent is extended or adjusted under 35 U.S.C. 154(b) by 509 days.

(21) Appl. No.: 17/890,592

(22) Filed: Aug. 18, 2022

(65) Prior Publication Data

US 2024/0063067 A1     Feb. 22, 2024

(51) Int. Cl.
| | |
|---|---|
| *H01L 23/14* | (2006.01) |
| *H01L 21/56* | (2006.01) |
| *H01L 23/00* | (2006.01) |
| *H01L 23/13* | (2006.01) |

(52) U.S. Cl.
CPC ............ *H01L 23/13* (2013.01); *H01L 21/563* (2013.01); *H01L 24/16* (2013.01); *H01L 24/32* (2013.01); *H01L 24/73* (2013.01); *H01L 24/83* (2013.01); *H01L 2224/16221* (2013.01); *H01L 2224/32221* (2013.01); *H01L 2224/73204* (2013.01); *H01L 2224/8309* (2013.01); *H01L 2224/83091* (2013.01); *H01L 2224/83102* (2013.01); *H01L 2924/1511* (2013.01); *H01L 2924/15151* (2013.01)

(58) Field of Classification Search
CPC ........ H01L 23/14; H01L 21/563; H01L 23/13
See application file for complete search history.

(56) References Cited

U.S. PATENT DOCUMENTS

| | | | | |
|---|---|---|---|---|
| 5,919,329 | A * | 7/1999 | Banks | H01L 21/563 257/E21.503 |
| 2007/0269930 | A1* | 11/2007 | Gupta | H01L 24/28 438/108 |
| 2014/0041911 | A1* | 2/2014 | Lee | H01L 24/05 174/250 |
| 2016/0056063 | A1* | 2/2016 | Chuang | H01L 21/67126 425/110 |
| 2023/0178445 | A1* | 6/2023 | Aoki | H01L 21/67126 257/737 |

\* cited by examiner

*Primary Examiner* — Errol V Fernandes
(74) *Attorney, Agent, or Firm* — Dorsey & Whitney LLP

(57) ABSTRACT

This document discloses techniques, apparatuses, and systems for a semiconductor device with a porous air vent. The semiconductor device includes a semiconductor die mounted to a substrate at one or more contact pads. Underfill material is disposed between the semiconductor die and the substrate. The substrate includes a porous portion composed of a porous material. The porous material is such that air, but not the underfill material, may pass from an area between the semiconductor die and the substrate to an area below the substrate. As a result, air may pass through the porous portion during the underfill process and the underfill material may be retained. Thus, voids and back contamination may be limited to assemble a reliable semiconductor device

20 Claims, 8 Drawing Sheets

US 12,347,737 B2

1

SEMICONDUCTOR DEVICE WITH A POROUS AIR VENT

TECHNICAL FIELD

The present disclosure generally relates to semiconductor device assemblies, and more particularly relates to semiconductor devices with a porous air vent.

BACKGROUND

Microelectronic devices generally have a die (i.e., a chip) that includes integrated circuitry with a high density of very small components. Typically, dies include an array of very small bond pads electrically coupled to the integrated circuitry. The bond pads are external electrical contacts through which the supply voltage, signals, etc., are transmitted to and from the integrated circuitry. After dies are formed, they are "packaged" to couple the bond pads to a larger array of electrical terminals that can be more easily coupled to the various power supply lines, signal lines, and ground lines. Conventional processes for packaging dies include electrically coupling the bond pads on the dies to an array of leads, ball pads, or other types of electrical terminals, and encapsulating the dies to protect them from environmental factors (e.g., moisture, particulates, static electricity, and physical impact).

DETAILED DESCRIPTION

Semiconductor devices are integrated in many devices to implement memory cells, processor circuits, imager devices, and other functional features. As more applications for semiconductor devices are discovered, designers are tasked with creating improved devices with improved reliability. Semiconductor devices include semiconductor dies assembled onto a substrate to mechanically support the semiconductor dies or provide connectivity to one or more other circuit components. These assemblies may be improved through any number of techniques that have been developed to increase the reliability of semiconductor devices.

One such technique is to dispose an underfill material between a substrate and a semiconductor die coupled to the substrate. The underfill material may be dispensed along the edge of the semiconductor die to enable the underfill material to flow into the area between the substrate and the semiconductor die. In doing so, the underfill material may structurally support the coupling between the die and the substrate and electrically insulate the connections between the die and the substrate. This technique, however, may introduce additional points of failure into semiconductor devices, for example, as can be seen with reference to semiconductor device assemblies 100 illustrated in FIGS. 1A-1C.

Figure 1A:
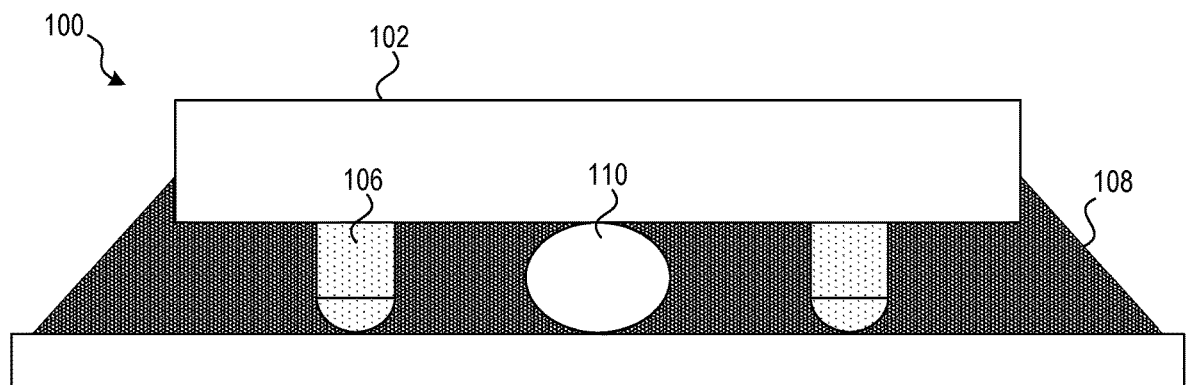
FIGS. 1A-1C illustrates a simplified schematic cross-sectional view of an example semiconductor device assembly.

FIG. 1A illustrates an example semiconductor device assembly that includes a semiconductor die 102 coupled to a substrate 104 (e.g., in a flip-chip arrangement in which a plurality of interconnects 106 are formed between contacts on the substrate 104 and corresponding contacts on the semiconductor die 102). Substrate 104 may further include package-level contact pads for providing external connectivity (e.g., via solder balls) to the semiconductor die 102 (e.g., power, ground, and I/O signals) through traces, lines, vias, and other electrical connection structures (not illustrated) in the substrate 104 that electrically connect the package-level contact pads to the contacts. An underfill material 108 (e.g., capillary underfill) is provided between the semiconductor die 102 and the substrate 104 to provide electrical insulation to the interconnects 106.

One drawback to this arrangement is that voids 110 may be created in an area between the substrate 104 and the semiconductor die 102. Voids 110 may be created when gaseous material present during an underfill process (e.g., atmospheric air, nitrogen gas, or any other gaseous material) is trapped between portions of the underfill material 108, for example, due to the flow of the underfill material when it is deposited around the semiconductor die 102. These voids 110 may create structural vulnerabilities or non-electrically insulated areas between the semiconductor die 102 and the substrate 104. In some cases, this may result in failure of the coupling between the semiconductor die 102 and the substrate 104.

Figure 1B:
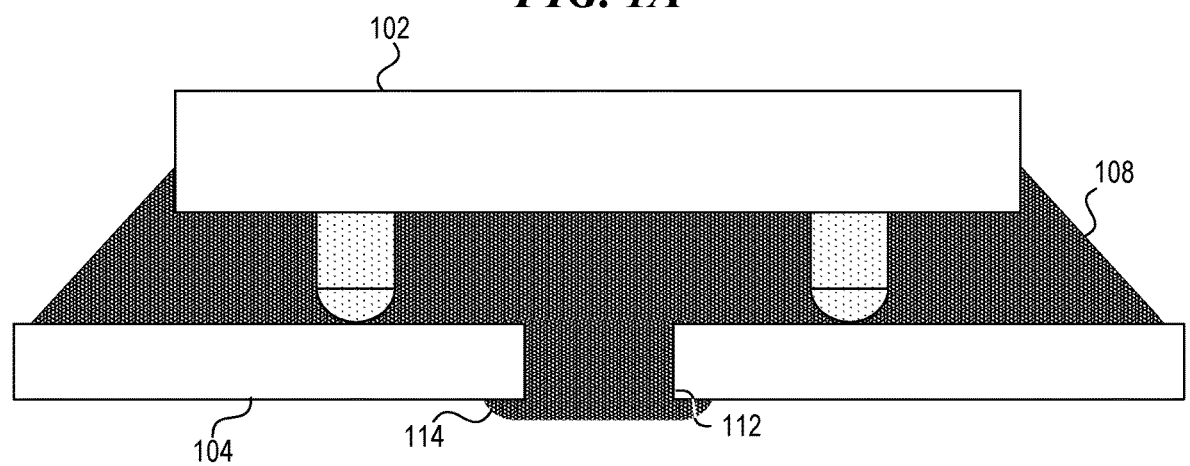

One technique for eliminating voids 110 from the underfill material 108 is illustrated in FIG. 1B. The substrate 104 may include vent holes 112 at which gaseous material trapped between the semiconductor die 102 and the substrate 104 may escape. During the underfill process, gaseous material may pass through the gaseous material vent holes 112, reducing the likelihood of voids occurring between the substrate 104 and the semiconductor die 102. In some cases, however, underfill material 108 may also pass through the vent holes 112 and cause back contamination 114 at the back side of the substrate 104 (e.g., the lower surface as illustrated). The back contamination 114 may interfere with external connections at the back side of the substrate 104 impacting the connectivity of the semiconductor device. Moreover, the back contamination 114 may affect the planarity of the back side of the substrate 104, which may make it difficult to install the semiconductor device in an electronic device.

Figure 1C:
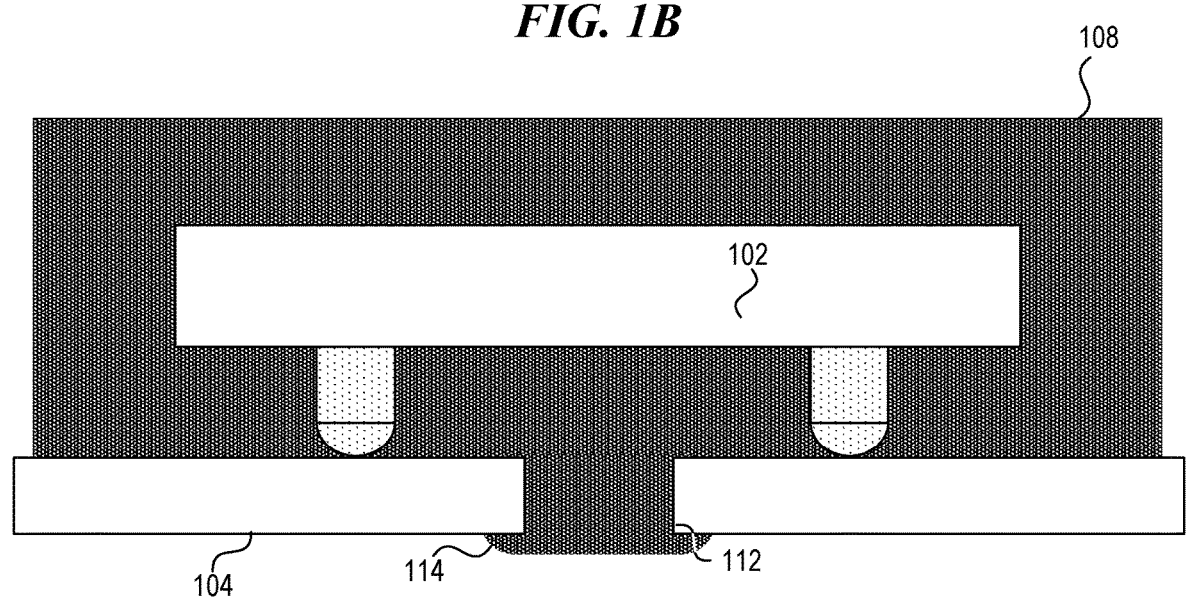

FIG. 1C illustrates a similar technique for a molded underfill process. Underfill material 108 (e.g., resin) is dispensed in a mold around a semiconductor die 102 and a substrate 104. The substrate 104 includes vent holes 112 to enable gaseous material to pass through the substrate 104. However, underfill material 108 may pass through the substrate 104 at the vent holes 112 causing back contamination 114 at the back side of the substrate 104. Like the semiconductor device assembly of FIG. 1B, the back contamination 114 may interfere with external connections at the back side of the substrate 104 or affect the planarity of the back side of the substrate 104.

To address these drawbacks and others, various embodiments of the present application provide semiconductor device assemblies that include a semiconductor die mounted to a substrate. Underfill material is disposed between the semiconductor die and the substrate. The substrate includes a porous portion composed of a porous material. The porous material is such that gaseous material, but not the underfill material, may pass from an area between the semiconductor die and the substrate to an area below the substrate. As a result, gaseous material may pass through the porous portion during the underfill process and the underfill material may be retained. Thus, voids and back contamination may be limited to assemble a reliable semiconductor device.

The technology disclosed herein relates to semiconductor devices, systems with semiconductor devices, and related methods for manufacturing semiconductor devices. The term "semiconductor device" generally refers to a solid-state device that includes one or more semiconductor materials. Examples of semiconductor devices include logic devices, memory devices, and diodes, among others. Furthermore, the term "semiconductor device" can refer to a finished device or to an assembly or other structure at various stages of processing before becoming a finished device. Depending upon the context in which it is used, the term "substrate" can refer to a structure that supports electronic components (e.g., a die), such as a wafer-level substrate or a die-level substrate, or another die for die-stacking or 3DI applications. The substrate may be a carrier substrate (e.g., temporary substrate) to structurally support one or more dies during fabrication or assembly.

Although some examples may be illustrated or described with respect to dies or wafers, the technology disclosed herein may apply to dies or wafers. Furthermore, unless the context indicates otherwise, structures disclosed herein can be formed using conventional semiconductor-manufacturing techniques. Materials can be deposited, for example, using chemical vapor deposition, physical vapor deposition, atomic layer deposition, spin coating, and/or other suitable techniques. Similarly, materials can be removed, for example, using plasma etching, wet etching, chemical-mechanical planarization, or other suitable techniques.

The devices discussed herein, including a memory device, may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

As used herein, the terms "vertical," "lateral," "upper" and "lower" can refer to relative directions or positions of features in the semiconductor die assemblies in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down and left/right can be interchanged depending on the orientation.

Figure 2:
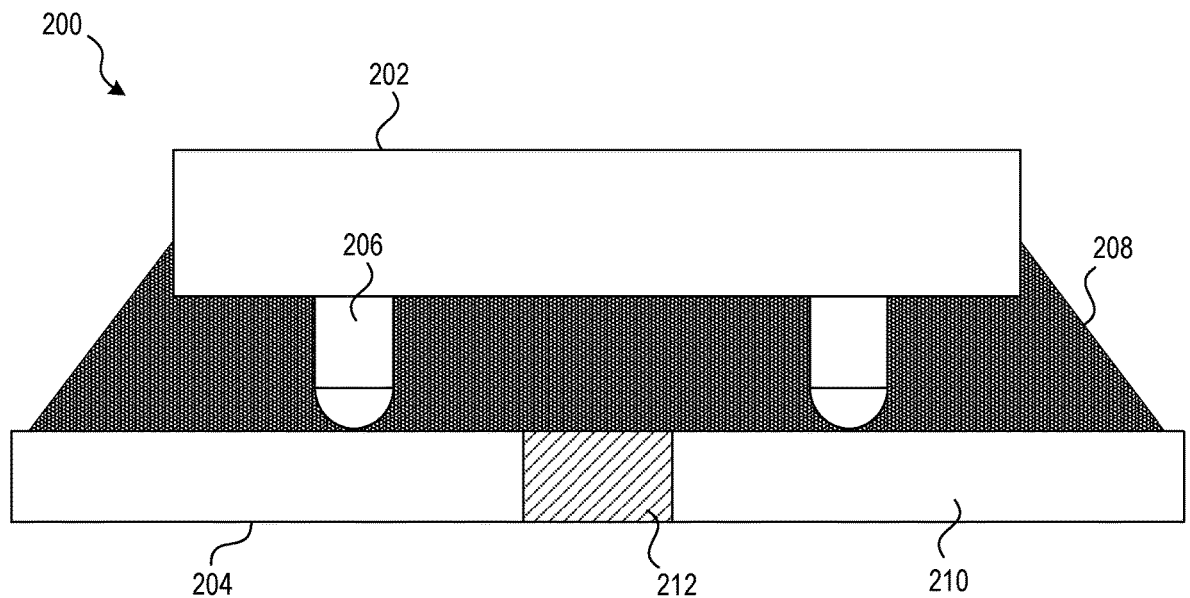
FIG. 2 illustrates a simplified schematic cross-sectional view of a semiconductor device assembly in accordance with an embodiment of the present technology.

FIG. 2 is a simplified schematic cross-sectional view of a semiconductor device assembly 200 in accordance with embodiments of the present technology. As can be seen with reference to FIG. 2, assembly 200 can include a semiconductor die 202 mounted on a substrate 204 (e.g., in a flip-chip arrangement in which a plurality of interconnects 206 are formed between contacts on the upper surface of the substrate 204 and corresponding pads on the semiconductor die 202). The semiconductor die 202 may be mounted to the substrate 204 such that an active surface of the die 202 on which circuitry is disposed (e.g., the lower surface as illustrated) faces the substrate 204. Substrate 204 can further include package-level contact pads for providing external connectivity (e.g., via solder balls) to the semiconductor die 202 (e.g., power, ground, and I/O signals) through traces, lines, vias, and other electrical connection structures (not illustrated) in the substrate 204 that electrically connect the package-level contact pads (e.g., at the lower surface) to the contact pads at the upper surface. An underfill material 208 (e.g., capillary underfill, epoxy mold compound (EMC)) can be provided between the semiconductor die 202 and the substrate 204 to provide structural support to the semiconductor device or electrical insulation to the interconnects 206.

In accordance with one aspect of the present disclosure, the substrate 204 can include a solid portion 210 and a porous portion 212. The solid portion 210 may be composed of a first material, such as a solid material (e.g., non-porous material, core material, prepreg, copper, solder mask, etc), that prevents gaseous material and the underfill material 208 from passing through the substrate 204 at the solid portion 210. The porous portion 212 may be composed of a second material, such as a porous material, the enables gaseous material to pass through the substrate 204 at the porous portion 212 but prevents underfill material 208 from passing through the substrate 204 at the porous portion 212. Gaseous material may pass through the substrate 204 at the porous portion 212 during an underfill process, which may reduce the occurrence of voids in between the semiconductor die 202 and the substrate 204. Additionally, the porous material may prevent the underfill material 208 from passing from the upper surface of the substrate 204 to the lower surface of the substrate 204 through the porous portion 212.

The solid portion 210 and the porous portion 212 of the substrate 204 may include any number of materials. The solid portion 210 of the substrate 204 may include one or more semiconductor materials, for example, silicon, germanium, silicon-germanium alloy, gallium arsenide, gallium nitride, etc. The solid portion 210 may be used to dispose connective circuitry, for example, traces, lines, vias, and other connective structures. The porous portion 210 of the substrate 210 may include any porous material that enables gaseous material to pass through the material but prevents the underfill material 208 from passing through the material. For example, the porous portion 210 of the substrate 210 may include any material that has pores larger than a size of a molecule of the gaseous material but smaller than the size of a molecule of the underfill material 208. As a non-limiting example, the porous portion 212 may include a polytetrafluoroethylene (PTFE), a porous ceramic, or any other porous material.

The porous portion 212 of the substrate 204 may extend entirely through a thickness dimension of the substrate 204 (e.g., the vertical dimension as illustrated). The porous portion 212 may be exposed to the underfill material 208 at an upper surface and exposed to gaseous material at a bottom surface. The porous portion 212 may be laterally surrounded by the solid portion 210 (e.g., enclosed by the solid portion 210 except at the upper surface and at the lower surface). In this way, gaseous material may pass through the porous portion 212 without having to pass through the solid portion 210. The upper surface of the porous portion 212 may be coplanar or substantially coplanar with the upper surface of the substrate 204. Similarly, the lower surface of the porous portion 212 may be coplanar or substantially coplanar with the lower surface of the substrate 204.

Figure 3:
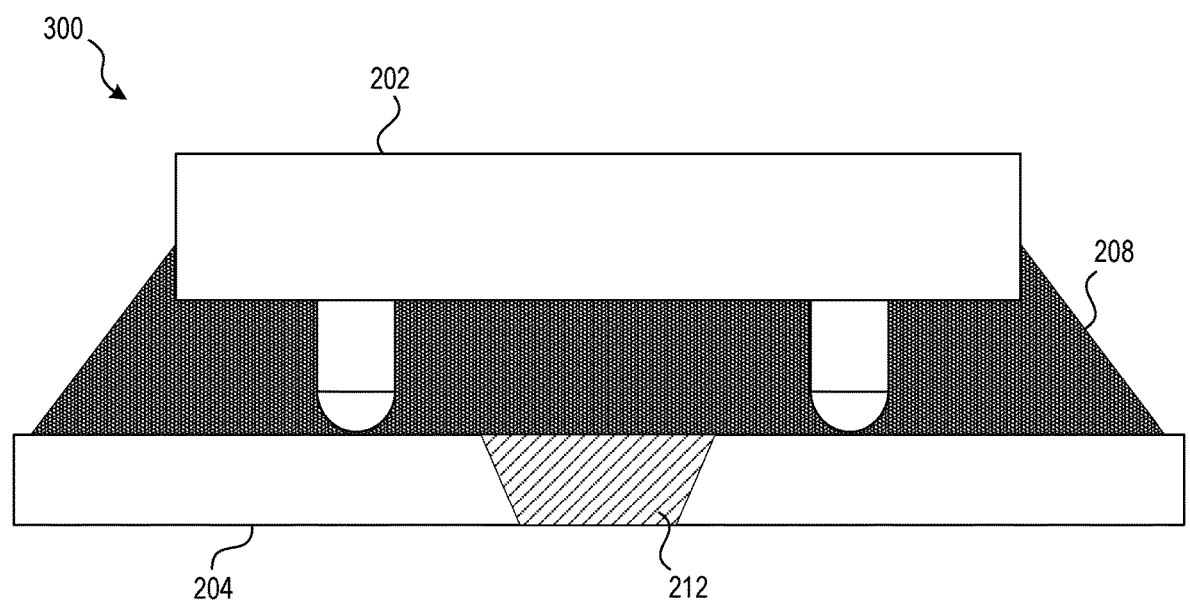
FIG. 3 illustrates a simplified schematic cross-sectional view of a semiconductor device assembly in accordance with an embodiment of the present technology.

FIG. 3 is a simplified schematic cross-sectional view of a semiconductor device assembly 300 in accordance with embodiments of the present technology. As can be seen with reference to FIG. 3, the assembly 300 includes the semiconductor die 202 assembled onto the substrate 204 (e.g., in a flip-chip arrangement). The substrate 204 has a solid portion 210 made of a solid material and a porous portion 212 made of a porous material. As illustrated, the porous portion 212 extends entirely through the substrate 204 such that the porous portion 212 of the substrate 204 is exposed to the underfill material 208 at the upper surface and gaseous material at the lower surface. The porous portion 212 may be tapered along a thickness dimension of the substrate 204 (e.g., the vertical dimension as illustrated). For example, a surface area of the porous portion 212 at the upper surface may be larger than a surface area of the porous portion 210 at the lower portion, or vice versa. Alternatively or additionally, the cross section of the porous portion 212 may have any other shape, for example, the cross section of the porous portion 212 may be rectangular, trapezoidal, rhomboidal, elliptical, or the like.

Figure 4:
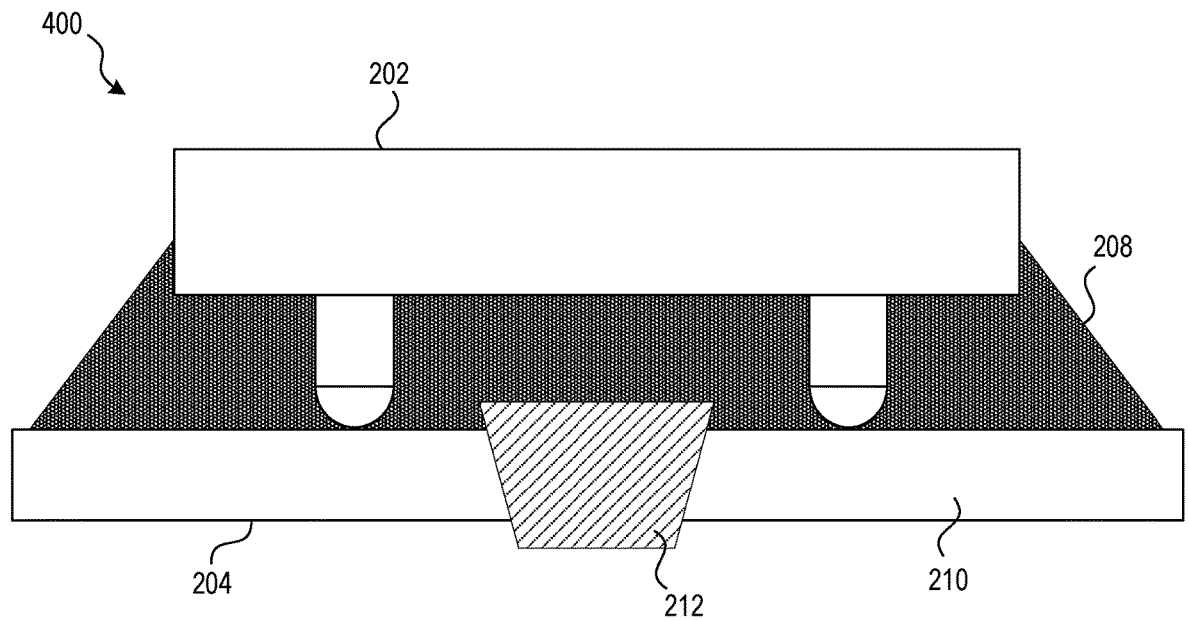
FIG. 4 illustrates a simplified schematic cross-sectional view of a semiconductor device assembly in accordance with an embodiment of the present technology.

FIG. 4 is a simplified schematic cross-sectional view of a semiconductor device assembly 400 in accordance with embodiments of the present technology. As can be seen with reference to FIG. 4, the assembly 400 includes the semiconductor die 202 assembled onto the substrate 204 (e.g., in a flip-chip arrangement). The substrate 204 has a solid portion 210 made of a solid material and a porous portion 212 made of a porous material to enable gaseous material to pass from the upper surface to the lower surface while preventing the underfill material 208 from passing from the upper surface to the lower surface. In contrast to the semiconductor device assemblies illustrated in FIGS. 2 and 3, the porous portion 212 of the substrate 204 extends from the upper surface and the lower surface of the substrate 204.

An upper surface of the porous portion 212 may extend from the upper surface of the substrate 204 by any distance (e.g., one, two, five, ten, twenty, etc. micrometers). Similarly, a lower surface of the porous portion 212 may extend below a lower surface of the substrate 204 by any distance (e.g., one, two, five, ten, twenty, etc. micrometers). The porous portion 212 may extend from the substrate 204 at the upper surface but not at the lower surface, or vice versa. The thickness of the porous portion 212 may be greater than a thickness of the substrate 204 or the thickness of the solid portion 210.

Figure 5:
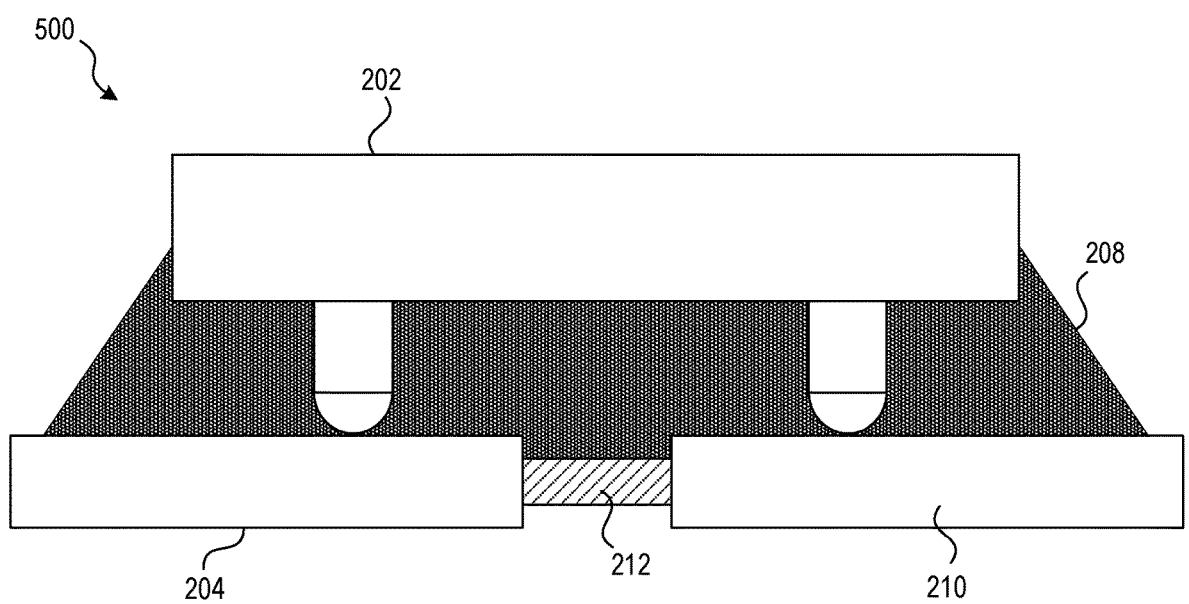
FIG. 5 illustrates a simplified schematic cross-sectional view of a semiconductor device assembly in accordance with an embodiment of the present technology.

FIG. 5 is a simplified schematic cross-sectional view of a semiconductor device assembly 500 in accordance with embodiments of the present technology. As can be seen with reference to FIG. 5, the assembly 500 includes the semiconductor die 202 assembled onto the substrate 204 (e.g., in a flip-chip arrangement). The substrate 204 has a solid portion 210 made of a solid material and a porous portion 212 made of a porous material to enable gaseous material to pass from the upper surface to the lower surface while preventing the underfill material 208 from passing from the upper surface to the lower surface. In contrast to the semiconductor device assemblies illustrated in FIGS. 2 through 4, the semiconductor device 500 includes a porous portion 212 having an upper surface recessed from the upper surface of the substrate 204 and a lower surface recessed from the lower surface of the substrate 204.

The thickness of the porous portion 212 may be less than a thickness of the solid portion 210 or a thickness of the substrate 204. The porous portion 212 may be thinner than the substrate 204 by any amount, for example, the substrate 204 may be two, three, or four times thicker than the porous portion 212. Although the porous portion 212 may be thinner than the substrate 204, the porous portion 212 may still extend entirely through the substrate 204 such that the solid portion 210 does not cover an upper portion or a lower portion of the porous portion 212. As such, the underfill material 208 may be retained at the upper surface of the substrate 204 and gaseous material may pass through the substrate 204 at the porous portion 212.

Figure 6:
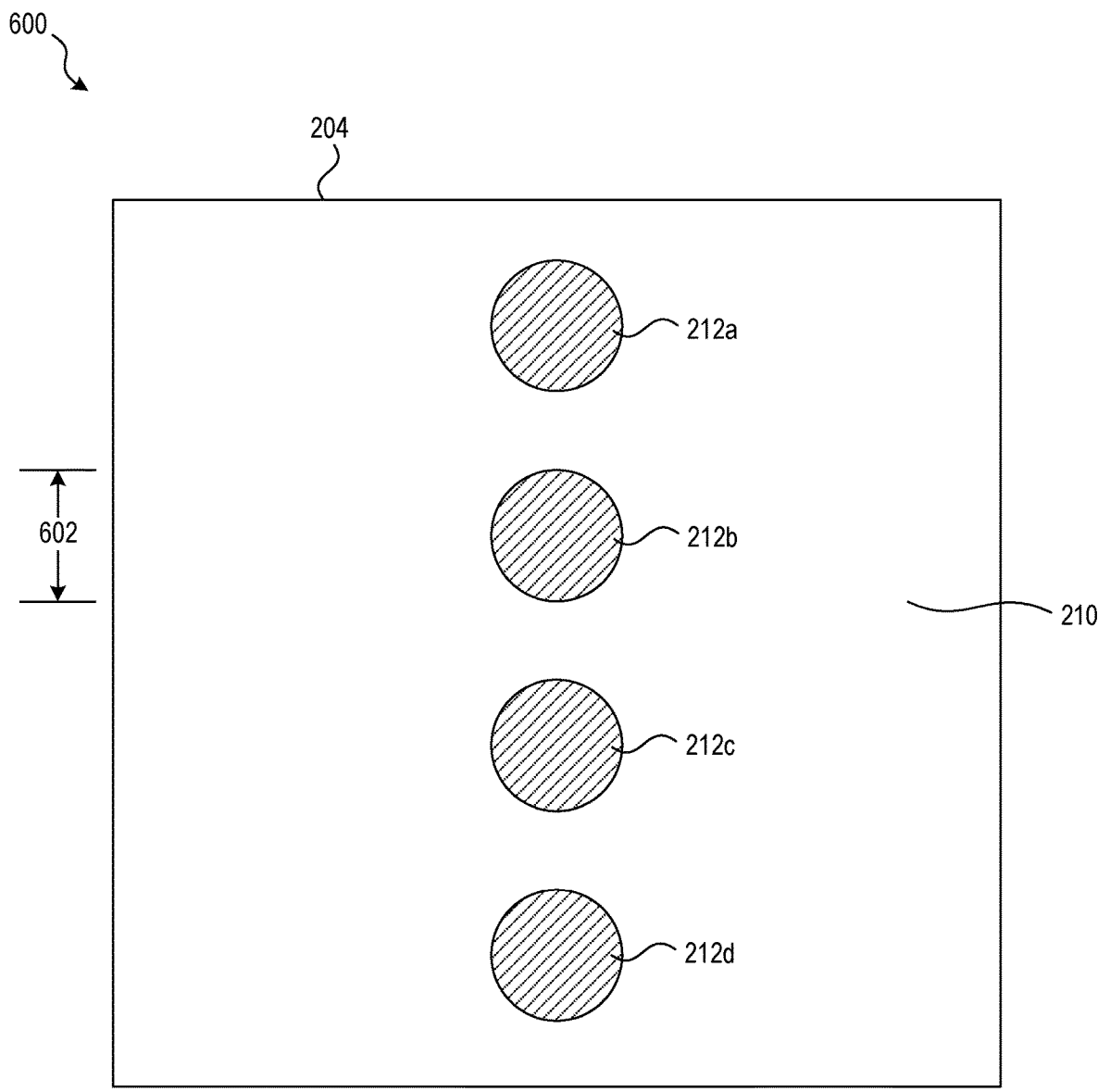
FIG. 6 illustrates a simplified schematic partial plan view of a semiconductor device assembly in accordance with an embodiment of the present technology.

FIG. 6 is a simplified schematic partial plan view of a semiconductor device assembly 600 in accordance with embodiments of the present technology. The semiconductor device assembly 600 illustrated in FIG. 6 may correspond to a top-down view of the substrate 204. The substrate 204 includes a solid portion 210 that is composed of a solid material and a porous portion 212 that is composed of a porous material. The porous portion 212 may include a plurality of discrete and separate portions (e.g., porous portion 212a, 212b, 212c, and 212d) throughout the substrate 204. The porous portion 212 may be located at any point of the substrate 204. For example, the porous portion 212 may be located at the middle of the substrate 204, near the edge of the substrate 204, or at any location in between. When multiple discrete portions are implemented for the porous portion 212, each discrete portion may be located at different location from any of the other discrete portions.

The porous portion 212 may have any shape or size. For example, the porous portion 212 may have a rectangular, trapezoidal, elliptical, rhomboidal, or any other cross section. Each discrete portion of the porous portion 212 may have a same or different shape. The porous portion 212 may be implemented with any size, which, for example, may be measured as a largest distance across a cross-section of the porous portion 212. Each of the discrete portions may have a same or different size from any of the other discrete portions. As illustrated, each of the discrete portions of the porous portion 212 has size 602. As a non-limiting example, the size 602 of the porous portion 212 may be larger than twenty micrometers.

The substrate 204 may be implemented such that the solid portion 210 is continuous. Connective circuitry may be implemented at the solid portion 210 to enable the substrate 204 or any semiconductor die coupled thereto to communicate with one or more external circuit components. Thus, it may be appropriate to implement the solid portion 210 as a continuous portion, to enable internal circuitry to be routed to any part of the solid portion 210. In some implementations, the solid portion 210 may make up a larger portion than the porous portion 212 (e.g., two, three, five, ten, one hundred times as large) to enable a sufficient number of connection components to be implemented at the substrate 204. In aspects, the solid portion 210 may laterally surround the porous portion 212.

Figure 7:
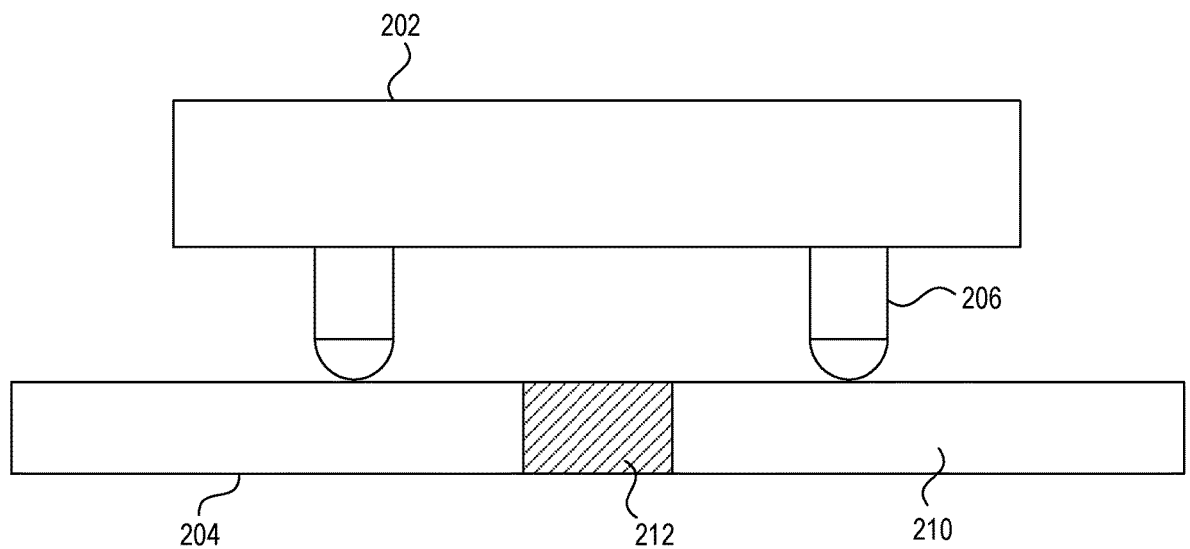
FIGS. 7 and 8A-8B illustrate simplified schematic cross-sectional views of a series of fabrication steps of semiconductor device assemblies in accordance with an embodiment of the present technology.
Figure 8A:
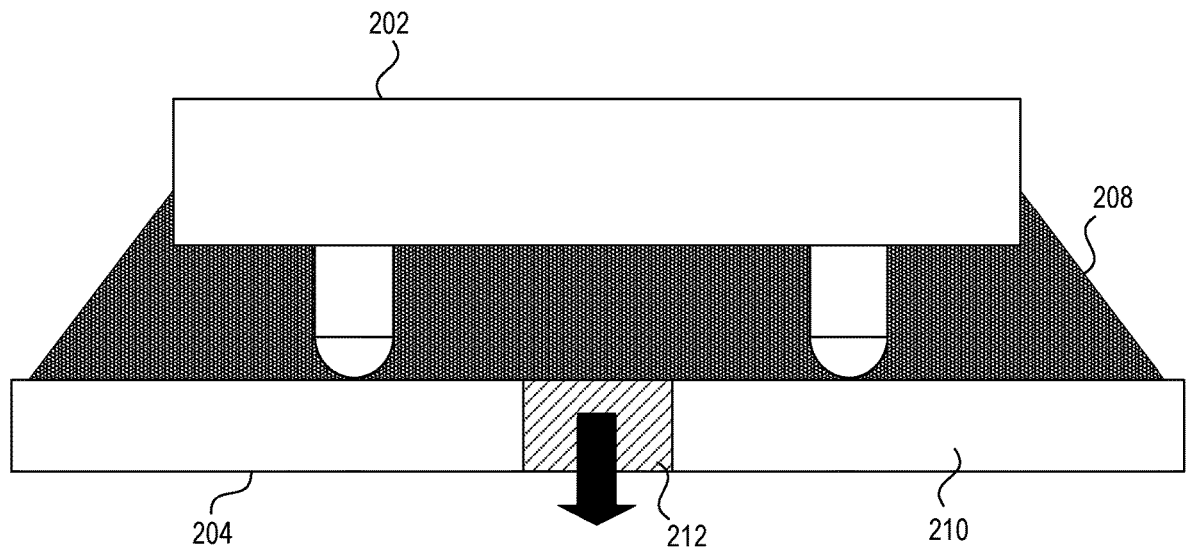
Figure 8B:
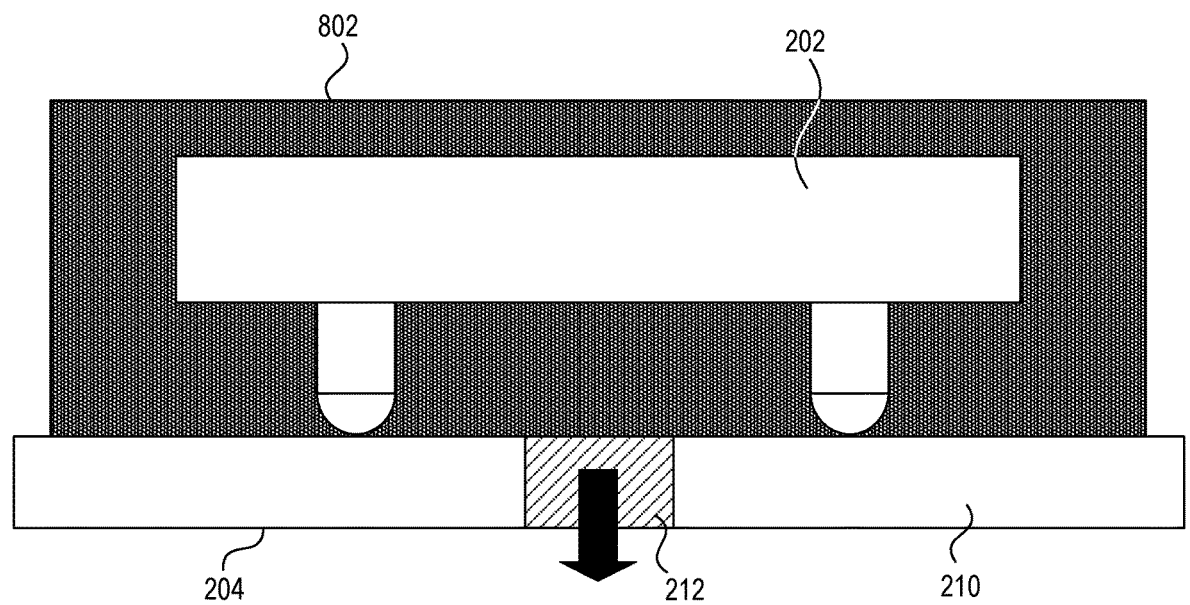

FIGS. 7 and 8A-8B are simplified schematic cross-sectional views illustrating a series of fabrication steps of semiconductor device assemblies in accordance with an embodiment of the present technology. Beginning with FIG. 7, a semiconductor die 202 and a substrate 204 (e.g., in wafer-level, panel-level, strip-level, or in some embodiments, pre-singulated) are provided. The substrate 204 may include one or more contacts, arranged at the upper surface to align with the contacts of a semiconductor die 202, and one or more pluralities of package-level contacts connected to the contacts on the upper surface by traces, lines, vias, and other electrical connection structures. The semiconductor die 202 may include an active surface at which circuitry is disposed (e.g., the lower surface as illustrated). The semiconductor die 202 may be provided such that interconnects 206 couple the semiconductor die 202 to the substrate 204 at the one or more contacts. The semiconductor die 202 may be coupled to the substrate 204 such that the active surface faces the upper surface of the substrate 204.

The substrate 204 includes a solid portion 210 made of a solid material and a porous portion 212 made of a porous material. The porous portion 202 may be manufactured at the time the substrate 204 is manufactured. For example, the substrate 204 may be a semiconductor wafer with a solid portion 210 made from a semiconductor material (e.g., silicon, gallium, germanium, etc.) and a porous portion 212 made of a porous material (e.g., PTFE). Alternatively, the porous portion 212 may be created after the substrate 204 has been manufactured. For example, the substrate 204 may be designed with vent holes, and the porous portion 212 may be a plug of porous material that is placed in the vent holes. In this case, the porous portion 212 may be adhered to the solid portion 210 through one or more adhesives.

Turning to FIGS. 8A-8B, an underfill material 208 is disposed between a semiconductor die 202 and a substrate 204. A capillary underfill technique and a molded underfill technique for disposing the underfill material 208 are described with respect to FIGS. 8A and 8B, respectively.

Beginning with FIG. 8A, underfill material 208 (e.g., capillary underfill, epoxy resin) is disposed between the semiconductor die 202 and the substrate 204 using a capillary underfill technique. The underfill material 208 may be disposed at the substrate 204 around the semiconductor die 202. The underfill material 208 may be heated and surface tension may cause the underfill material 208 to flow into capillaries between the die 202 and the substrate 204. During the flow of the underfill material 208, gaseous material may pass from the upper surface of the substrate 204 to the lower surface through the porous portion 212, while the underfill material 208 may be prevented from passing through the substrate 204 and contaminating the back of the substrate 204. The underfill material 108 may be heated in a pressurized cure oven to cause the underfill material to cure under the die 202. The pressurization may cause gaseous material trapped between the die 202 and the substrate 204 to escape through the porous portion 212 of the substrate 204, while the underfill material 208 is prevented from passing through the substrate 204. As a result, the underfill material 208 may be disposed between the die 202 and the substrate 204 without voids or back contamination occurring. Once the underfill material 208 is cured, the semiconductor device may be packaged by at least partially encapsulating the die using an encapsulant to protect them from environmental factors (e.g., moisture, particulates, static electricity, and physical impact). The packaged semiconductor device may then be installed onto a printed circuit board (PCB) to provide functionality to a device in which it is implemented.

Turning to FIG. 8B, underfill material 208 (e.g., EMC) is disposed between the semiconductor die 202 and the substrate 204 using a molded underfill technique. A mold may be placed over the semiconductor die 202 and the substrate 204 and underfill material 208 may be dispensed into the mold around the substrate 204 and the semiconductor die 202. As the underfill material 208 is dispensed into the mold, gaseous material trapped between the semiconductor die 202 and the substrate 204 may escape through the porous portion 212 of the substrate 204. Once filled, the mold may be placed into a pressurized cure oven where the underfill material 208 is heated to cure underfill material 208 between the die 202 and the substrate 204. The pressurization may cause gaseous material trapped between the die 202 and the substrate 204 to escape through the porous portion 212 of the substrate 204, while the underfill material 208 is prevented from passing through the substrate 204. Alternatively or additionally, a vacuum condition may be created outside the mold (e.g., at a lower surface of the substrate 204) to cause gaseous material to be removed from between the semiconductor die 202 and the substrate 204 through the porous portion 212. As a result, the underfill material 208 may be disposed between the die 202 and the substrate 204 without voids or back contamination occurring. Once the underfill material 208 is cured, the semiconductor device may be at least partially encapsulated by the underfill material 208. By performing the underfill and encapsulant processes together, design complexity or development time may be reduced. The semiconductor device may then be installed onto a printed circuit board (PCB) to provide functionality to a device in which it is implemented.

Although in the foregoing example embodiment semiconductor device assemblies have been illustrated and described as including a particular number of semiconductor dies, in other embodiments assemblies can be provided with more or less semiconductor dies. For example, the two-die semiconductor devices illustrated in FIGS. 2 through 8 could be replaced with, e.g., a vertical stack of semiconductor devices or a plurality of semiconductor devices, mutatis mutandis. Similarly, although the porous material is described as being implemented on the substrate, the porous material may be implemented at the semiconductor die in addition or as an alternative to implementing the porous material at the substrate.

In accordance with one aspect of the present disclosure, the semiconductor devices illustrated in the assemblies of FIGS. 2-8B could be memory dies, such as dynamic random-access memory (DRAM) dies, NOT-AND (NAND) memory dies, NOT-OR (NOR) memory dies, magnetic random-access memory (MRAM) dies, phase change memory (PCM) dies, ferroelectric random-access memory (FeRAM) dies, static random-access memory (SRAM) dies, or the like. In an embodiment in which multiple dies are provided in a single assembly, the semiconductor devices could be memory dies of a same kind (e.g., both NAND, both DRAM, etc.) or memory dies of different kinds (e.g., one DRAM and one NAND, etc.). In accordance with another aspect of the present disclosure, the semiconductor dies of the assemblies illustrated and described above could be logic dies (e.g., controller dies, processor dies, etc.), or a mix of logic and memory dies (e.g., a memory controller die and a memory die controlled thereby).

Any one of the semiconductor devices and semiconductor device assemblies described above with reference to FIGS.

Figure 9:
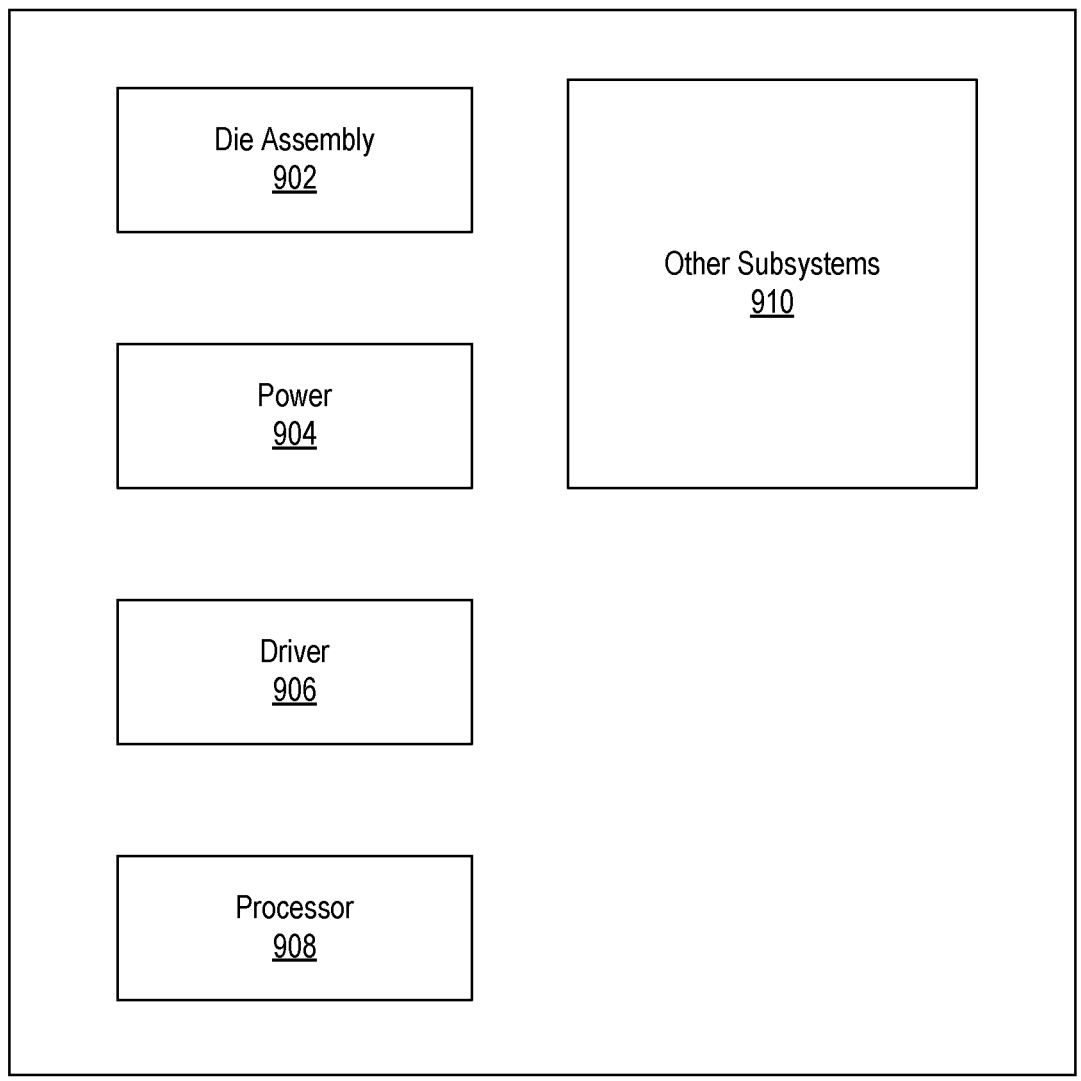
FIG. 9 illustrates a schematic view showing a system that includes a semiconductor device assembly configured in accordance with an embodiment of the present technology.

2-8B can be incorporated into any of a myriad of larger and/or more complex systems, a representative example of which is system 900 shown schematically in FIG. 9. The system 900 can include a semiconductor device assembly 902 (e.g., or a discrete semiconductor device), a power source 904, a driver 906, a processor 908, and/or other subsystems or components 910. The semiconductor device assembly 902 can include features generally similar to those of the semiconductor devices described above with reference to FIGS. 2-8B. The resulting system 900 can perform any of a wide variety of functions, such as memory storage, data processing, and/or other suitable functions. Accordingly, representative systems 900 can include, without limitation, hand-held devices (e.g., mobile phones, tablets, digital readers, and digital audio players), computers, vehicles, appliances and other products. Components of the system 900 may be housed in a single unit or distributed over multiple, interconnected units (e.g., through a communications network). The components of the system 900 can also include remote devices and any of a wide variety of computer-readable media.

Figure 10:
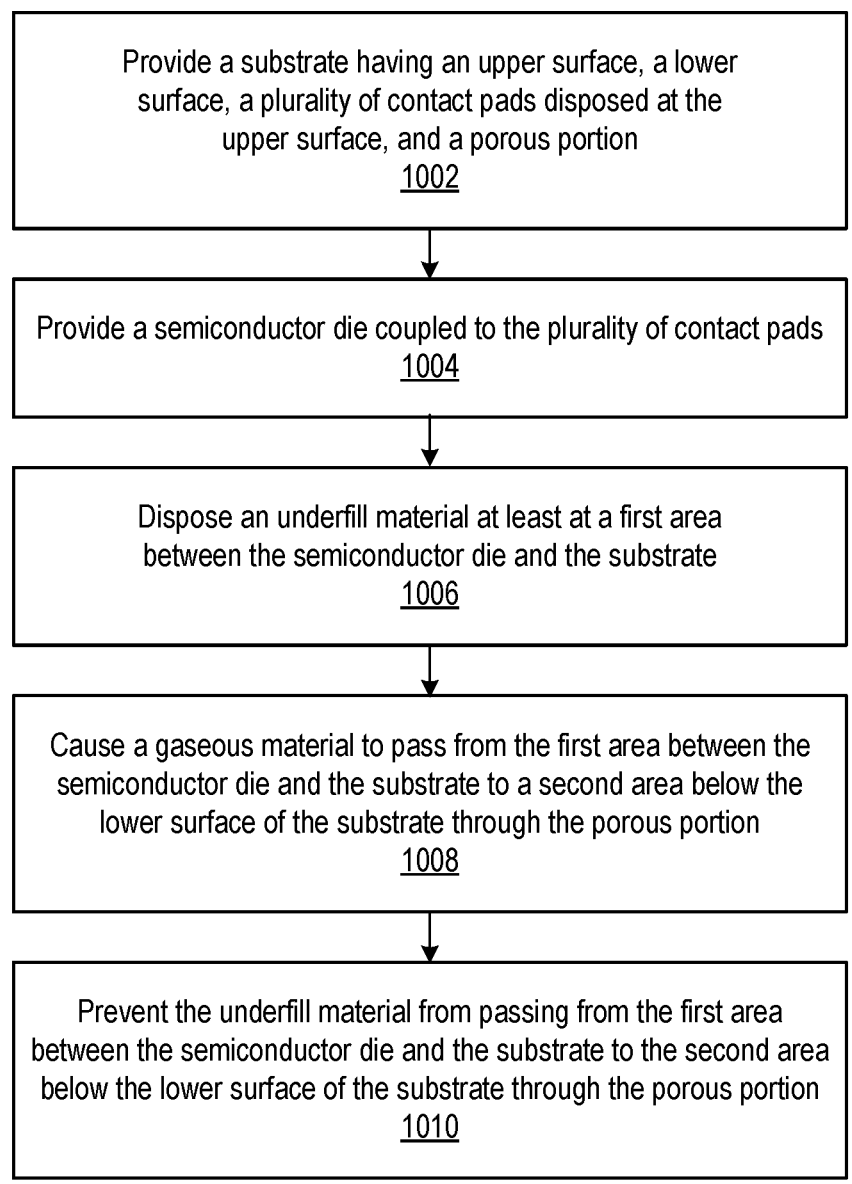
FIG. 10 illustrates an example method for fabricating a semiconductor device assembly in accordance with an embodiment of the present technology.

FIG. 10 illustrates an example method 1000 for fabricating a semiconductor device assembly in accordance with an embodiment of the present technology. The method 1000 may, for illustrative purposes, be described with respect to features, components, or elements of FIGS. 2-9. Although illustrated in a particular configuration, one or more operations of the method 1000 may be omitted, repeated, or reorganized. Additionally, the method 1000 may include other operations not illustrated in FIG. 10, for example, operations detailed in one or more other method described herein.

At 1002, substrate 204 is provided. The substrate 204 may include an upper surface, a lower surface, a plurality of contact pads disposed at the upper surface, and a porous material 212. The substrate 204 may include a solid portion 210 comprising a solid material that prevents gaseous material and underfill material 208 from passing from the upper surface to the lower surface through the solid portion 210. The porous portion 212 enables gaseous material to pass from the upper surface to the lower surface through the porous portion 212 and prevents the underfill material 208 from passing from the upper surface to the lower surface through the porous portion 212.

At 1004, a semiconductor die 202 is provided. The semiconductor die 202 may include an active side at which circuitry is disposed. The semiconductor die 202 may couple to the substrate 204 at the one or more contact pads disposed at the substrate 204. The semiconductor die 202 may be coupled to the substrate 204 such that the active surface of the semiconductor die 202 faces the upper surface of the substrate 204. At 1006, underfill material 208 is disposed at least between the semiconductor die 202 and the substrate 204. The underfill material 208 may be disposed using a capillary underfill technique or a molded underfill technique.

At 1008, a gaseous material is passed from the first area between the semiconductor die 202 and the substrate 204 to a second area below the lower surface of the substrate 204 through the porous portion 212. The semiconductor device may be heated to pressurize the area between the semiconductor die 202 and the substrate 204 to cause the gaseous material to pass through the porous portion 212. Alternatively or additionally, a vacuum condition may be created under the lower surface of the substrate 204 to cause the gaseous material to pass through the porous portion 212. At 1010, the underfill material 208 is prevented from passing through the substrate 204. In this way, performing the method 1000 may fabricate an underfilled semiconductor device without voids or back contamination.

The functions described herein may be implemented in hardware, software executed by a processor, firmware, or any combination thereof. Other examples and implementations are within the scope of the disclosure and appended claims. Features implementing functions may also be physically located at various positions, including being distributed such that portions of functions are implemented at different physical locations.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

What is claimed is:

1. A semiconductor device assembly, comprising:
 a substrate having an upper surface, a lower surface, and a plurality of contact pads disposed at the upper surface;
 a semiconductor die coupled to the plurality of contact pads; and
 an underfill material disposed at least between the semiconductor die and the substrate,
 wherein the substrate includes porous portion comprising a porous material that enables a gaseous material to pass from the upper surface to the lower surface through the porous portion and prevents the underfill material from passing from the upper surface to the lower surface through the porous portion.

2. The semiconductor device assembly of claim 1, wherein the semiconductor die is coupled to the plurality of contact pads such that an active surface of the semiconductor die faces the upper surface of the substrate and overlies the porous portion of the substrate.

3. The semiconductor device assembly of claim 1, wherein the porous portion extends entirely through the substrate.

4. The semiconductor device assembly of claim 1, wherein the underfill material comprises a capillary underfill or a molded underfill.

5. The semiconductor device assembly of claim 1, wherein:
an upper surface of the porous portion is coplanar with the upper surface of the substrate; or
a lower surface of the porous portion is coplanar with the lower surface of the substrate.

6. The semiconductor device assembly of claim 1, wherein the substrate further includes a solid portion comprising a solid material that prevents the gaseous material and the underfill material from passing from the upper surface to the lower surface through the solid portion.

7. The semiconductor device assembly of claim 6, wherein the porous portion is laterally surrounded by the solid portion.

8. The semiconductor device assembly of claim 1, wherein the porous material comprises polytetrafluoroethylene (PTFE).

9. The semiconductor device assembly of claim 1, wherein the porous portion comprises a plurality of discrete portions of the porous material throughout the substrate.

10. The semiconductor device assembly of claim 1, wherein the porous portion is tapered along a thickness dimension of the substrate extending between the upper surface of the substrate and the lower surface of the substrate.

11. A method of making a semiconductor device assembly, comprising:
providing a substrate having an upper surface, a lower surface, a plurality of contact pads disposed at the upper surface, and a porous portion;
providing a semiconductor die coupled to the plurality of contact pads;
disposing an underfill material at least at a first area between the semiconductor die and the substrate;
causing a gaseous material to pass from the first area between the semiconductor die and the substrate to a second area below the lower surface of the substrate through the porous portion; and
preventing the underfill material from passing from the first area between the semiconductor die and the substrate to the second area below the lower surface of the substrate through the porous portion.

12. The method of claim 11, further comprising disposing the underfill material at least between the semiconductor die and the substrate using a capillary underfill technique.

13. The method of claim 11, further comprising disposing the underfill material at least between the semiconductor die and the substrate using a molded underfill technique.

14. The method of claim 11, further comprising coupling the semiconductor die to the substrate such that an active surface of the semiconductor die faces the upper surface of the substrate and overlies the porous portion of the substrate.

15. The method of claim 11, wherein the substrate includes a solid portion comprising a solid material that laterally surrounds the porous portion.

16. The method of claim 11, further comprising creating a vacuum condition at the second area below the lower surface effective to cause the gaseous material to pass through the porous portion.

17. The method of claim 11, further comprising pressurizing the first area between the semiconductor die and the substrate effective to cause the gaseous material to pass through the porous portion.

18. A substrate comprising:
an upper surface;
a lower surface;
a solid portion comprising a solid material that prevents a gaseous material and underfill material from passing from the upper surface to the lower surface through solid portion; and
a porous portion comprising a porous material that enables the gaseous material to pass from the upper surface to the lower surface through the porous portion and prevents the underfill material from passing from the upper surface to the lower surface through the porous portion,
wherein the porous portion is laterally surrounded by the solid portion.

19. The substrate of claim 18, wherein the porous material comprises polytetrafluoroethylene (PTFE).

20. The substrate of claim 18, wherein:
an upper surface of the porous portion is coplanar with the upper surface of the substrate; or
a lower surface of the porous portion is coplanar with the lower surface of the substrate.

\* \* \* \* \*